United States Patent
Lu et al.

(10) Patent No.: US 9,962,728 B2
(45) Date of Patent: May 8, 2018

(54) FLUID DISPENSING MACHINE AND METHOD OF DISPENSING FLUID

(71) Applicants: Tyco Electronics Corporation, Berwyn, PA (US); Shenzhen AMI Technology Co., Ltd., Shenzhen (CN)

(72) Inventors: Roberto Francisco-Yi Lu, Bellevue, WA (US); Qinglong Zeng, Shenzhen (CN); Charles David Fry, New Bloomfield, PA (US); Bicheng Chen, Harrisburg, PA (US)

(73) Assignees: TE CONNECTIVITY CORPORATION, Berwyn, PA (US); SHENZHEN AMI TECHNOLOGY CO., Shenzhen (CN)

( * ) Notice: Subject to any disclaimer, the term of this patent is extended or adjusted under 35 U.S.C. 154(b) by 539 days.

(21) Appl. No.: 13/833,645

(22) Filed: Mar. 15, 2013

(65) Prior Publication Data

US 2014/0079871 A1    Mar. 20, 2014

Related U.S. Application Data

(60) Provisional application No. 61/703,364, filed on Sep. 20, 2012.

(51) Int. Cl.
*B05C 9/10* (2006.01)
*B05D 1/00* (2006.01)
(Continued)

(52) U.S. Cl.
CPC ............. *B05C 9/10* (2013.01); *B05C 5/0216* (2013.01); *B05C 11/1021* (2013.01); *B05D 1/00* (2013.01);
(Continued)

(58) Field of Classification Search
None
See application file for complete search history.

(56) References Cited

U.S. PATENT DOCUMENTS

| 5,110,615 A | * | 5/1992 | Maiorca | ............ H05K 13/0469 156/356 |
| 5,460,758 A | * | 10/1995 | Langer et al. | ................ 264/401 |

(Continued)

FOREIGN PATENT DOCUMENTS

| CN | 1510491 A | 7/2004 |
| CN | 1510491 A1 | 7/2004 |

(Continued)

OTHER PUBLICATIONS

International Search Report, International Application No. PCT/US2013/059111, International Filing Date, Sep. 11, 2013.

(Continued)

*Primary Examiner* — Dah-Wei D Yuan
*Assistant Examiner* — Jethro M Pence (57) ABSTRACT

A fluid dispensing machine includes a frame and a fixture held by the frame. The fixture is configured to support a substrate. A positioning system is supported by the frame. A guidance system is supported by the positioning system. The guidance system has a camera viewing the fixture that is movable relative to the fixture. A fluid dispenser is supported by the positioning system and is moved by the positioning system relative to the fixture. The fluid dispenser is configured to dispense fluid onto the substrate. A controller communicates with the positioning system and the guidance system. The controller operates the positing system to control a position of the fluid dispenser relative to the fixture based on an image obtained by the camera.

13 Claims, 5 Drawing Sheets

(51) Int. Cl.
*H05K 3/34* (2006.01)
*H05K 13/04* (2006.01)
*B05C 5/02* (2006.01)
*B05C 11/10* (2006.01)
*B05B 12/12* (2006.01)

(52) U.S. Cl.
CPC ....... *H05K 3/3484* (2013.01); *H05K 13/0469* (2013.01); *B05B 12/122* (2013.01); *H05K 2203/0126* (2013.01); *H05K 2203/163* (2013.01)

(56) References Cited

U.S. PATENT DOCUMENTS

| | | | |
|---|---|---|---|
| 5,614,024 | A | 3/1997 | Ishida et al. |
| 2003/0149505 | A1 | 8/2003 | Mogensen |
| 2004/0035306 | A1* | 2/2004 | Onishi et al. ................. 101/123 |
| 2004/0131757 | A1 | 7/2004 | Jung et al. |
| 2005/0235913 | A1* | 10/2005 | Prentice ................. H05K 13/08 118/712 |

FOREIGN PATENT DOCUMENTS

| | | | |
|---|---|---|---|
| DE | 10257567 | A1 | 1/2004 |
| DE | 10257567 | A1 | 7/2004 |

OTHER PUBLICATIONS

Search Report dated Mar. 22, 2016, for counterpart Chinese Patent Application No. 201380048026.7.

* cited by examiner

FLUID DISPENSING MACHINE AND METHOD OF DISPENSING FLUID

CROSS REFERENCE TO RELATED APPLICATIONS

This application claims the benefit of U.S. Provisional Application No. 61/703,364 filed Sep. 20, 2012, the subject matter of which is herein incorporated by reference in its entirety.

BACKGROUND OF THE INVENTION

The subject matter herein relates generally to fluid dispensing machines and methods of dispensing fluids.

Many electrical components are manufactured by connecting various components together. Some components are connected using a material therebetween, such as epoxy, adhesive, solder and the like. For example, wires may be soldered to pads on a circuit board using solder. The material is deposited in place on one component, also known as a substrate and the other component is placed n contact with the material to connect thereto. Other processes, such as curing, heating, soldering and the like may enhance the bond between the components and the material. The material may be applied by different processes, such as by applying, printing, spraying and the like. The material may be applied in different forms, such as in paste form, in liquid form, in powder form, and the like. The material may be deposited manually or by an automated process. Manual application is time consuming and increases the expense of the electrical component. Dimensional control of the fluid application is problematic for manual application. Quality control of the fluid application is also problematic for manual application. Automated processes also have disadvantages. For example, the automated process uses a preprogrammed control that does not take into account for the actual variation in positions of the components. Also, because the automated process does not have feedback during the application, the preprogrammed application overcompensates and applies additional material to ensure that a connection is made. Such overcompensation uses extra material, which becomes costly over time.

There is a need for a cost effective automated process of dispensing fluid without human operator intervention.

BRIEF DESCRIPTION OF THE INVENTION

In one embodiment, a fluid dispensing machine is provided including a frame and a fixture held by the frame. The fixture is configured to support a substrate. A positioning system is supported by the frame. A guidance system is supported by the positioning system. The guidance system has a camera viewing the fixture that is movable relative to the fixture. A fluid dispenser is supported by the positioning system and is moved by the positioning system relative to the fixture. The fluid dispenser is configured to dispense fluid onto the substrate. A controller communicates with the positioning system and the guidance system. The controller operates the positioning system to control a position of the fluid dispenser relative to the fixture based on an image obtained by the camera.

Optionally, the camera may be configured to image the substrate at a work area where the fluid is dispensed. The controller may differentiate the boundary between the dispensed fluid and the substrate. The controller may operate the positioning system to control a position of the fluid dispenser based on the boundary. The controller may develop a motion profile for the positioning system to move the fluid dispenser. The controller may develop a motion profile for the positioning system to move the fluid dispenser. The motion profile may be updated based on images taken by the camera during fluid dispensing.

Optionally, the fixture holds a plurality of the substrates at different stations. The positioning system may move the fluid dispenser from station to station to dispense fluid at each of the stations. The fluid dispenser may dispense solder paste along a conductive trace on the substrate. The camera may image the substrate after the fluid is dispensed to ensure proper dispensing of the fluid. The controller may cause the positioning system to move the fluid dispenser to re-dispense fluid in areas with in adequate fluid. The controller may update operation of the positioning system based on the new image of the substrate.

Optionally, the positioning system may include an X positioner, a Y positioner, and a Z positioner to control a position of the fluid dispenser in 3D space. The positioning system may include an angular positioner to control an angle of the fluid dispenser relative to the fixture.

Optionally, the guidance system may include an optical component affecting an image of the substrate taken by the camera. The optical component may have an illumination source emitting light at different wavelengths on the substrate. The controller may differentiate a boundary between the dispensed fluid and the substrate based on the light emitted by the illumination source. The controller may operate a boundary recognition algorithm determining a shape and position of the fluid on the substrate. The controller may determine a motion profile for moving the fluid dispenser based on the determined shape and positioning of the boundary.

In another embodiment, a method of dispensing fluid on a substrate is provided that includes holding the substrate on a fixture, capturing an image of the substrate using a camera, developing a motion profile based on the position of the substrate from the image using a controller, and moving a fluid dispenser to dispense fluid on the substrate based on the motion profile.

DETAILED DESCRIPTION OF THE INVENTION

Figure 1:
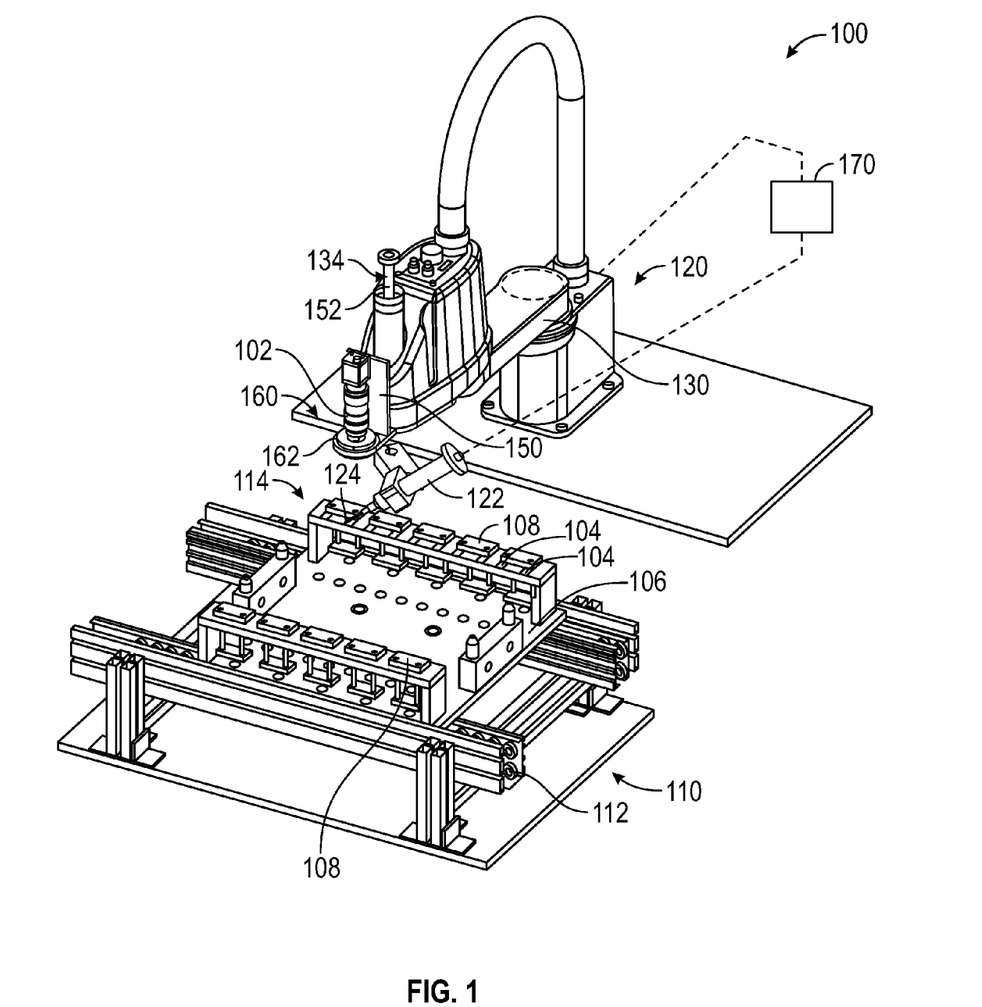
FIG. 1 illustrates a fluid dispensing machine formed in accordance with an exemplary embodiment.

FIG. 1 illustrates a fluid dispensing machine 100 formed in accordance with an exemplary embodiment. The fluid dispensing machine 100 is used for dispensing fluid onto a substrate 104. For example, epoxy, adhesive, solder or another type of engineering fluid may be dispensed onto the substrate 104. The substrate 104 may be a circuit board or other type of electrical component having conductive traces thereon. The fluid may be dispensed directly onto the conductive traces so other components, such as wires, may be connected thereto. The fluid dispensing machine 100 automatically dispenses the fluid into a predetermined location on the substrate 104 using an automated process.

The fluid dispensing machine 100 provides vision guidance using an optical image sensor, referred to hereinafter as a camera 102, to collect images and data relating to the substrate 104, to any components of the substrate 104 (e.g. conductive traces), to any dispensed fluid on the substrate 104, to any fluid dispensing component, and the like. The fluid dispensing machine 100 dynamically changes parameters and control of the components of the fluid dispensing machine 100 based on the images. For example, the parameters and control may be based on geometrical characteristic data obtained based upon the image captured by the camera 102. Optionally, multiple cameras may be provided for viewing the dispensing area from different angles. Any substrate 104 presented to the fluid dispensing machine 100 may have different characteristics, such as a different layout of conductive traces, different positioning relative to the fluid dispensing machine, or other characteristics that have use for vision guidance. The fluid dispensing machine 100 identifies specific characteristics of the substrate 104, the fluid dispensing component, the wire or other components, and properly positions the fluid dispenser relative to the substrate or other component for proper dispensing of the fluid.

In the illustrated embodiment, the fluid dispensing machine 100 processes a plurality of substrates 104. The substrates 104 are held on a fixture 106 by holders 108. Any number of substrates 104 may be held by the fixture 106 and presented to the fluid dispensing machine 100 as a batch. Alternatively, the substrates 104 may be individually presented to the fluid dispensing machine 100 rather than being presented as a batch as part of the fixture 106.

The fluid dispensing machine 100 includes a frame 110 that supports the various components of the fluid dispensing machine 100. The frame 110 may be stationary. The frame 110 may be part of a larger machine, such as positioned at a station before or after other stations. In an exemplary embodiment, the frame 110 includes a track 112. The fixture 106 may be conveyed along the track 112. Optionally, once the fixture 106 is positioned in a work zone 114 of the fluid dispensing machine 100, the fixture 106 may be held in place and restricted from moving along the track 112.

The fluid dispensing machine 100 includes a positioning system 120 supported by the frame 110. The positioning system 120 is used to position the camera 102 relative to the fixture 106 during operation of the fluid dispensing machine 100. The positioning system 120 is used to position a fluid dispenser 122 relative to the fixture 106 during operation of the fluid dispensing machine 100. The fluid dispenser 122 is used to dispense the engineering fluid at precise locations on the substrates 104, such as on portions of conductive traces of the substrates 104. The fluid dispenser 122 is movable in three dimensions according to a particular motion profile determined by the fluid dispensing machine 100 based on the particular arrangement of the conductive traces. Optionally, a tip 124 of the fluid dispenser 122 is moved into proximity with the substrates 104 to dispense fluid thereon. The tip 124 may be configurable to fine tune the dispensing application. For example, the tip 124 may be independently movable. In an exemplary embodiment, the positioning system 120 is a selective compliance assembly robot arm (SCARA). Other types of systems may be used in other embodiments, such as a Cartesian motion robot with rotary axis or other robotic motion system.

A coordinate system is illustrated in FIG. 1 showing mutually perpendicular X, Y and Z axes. In an exemplary embodiment, the positioning system 120 includes a rotary arm 130 that controls an X position and a Y position of the fluid dispenser 122 and camera 102. The positioning system 120 includes a Z positioner 134 for controlling a Z position of the fluid dispenser 122 and the camera 102. Optionally, the positioning system may include at least one angular positioner to allow angular movement of components of the fluid dispensing machine 100 in three dimensional space. Other types of positioners may be used in alternative embodiments to control the positions of the fluid dispenser 122 and camera 102. The positioners include motors that control movements, which may be electric motors, pneumatic motors, or other types of motors. The motors may be servo motors.

In an exemplary embodiment, a bracket 150 is attached to an arm 152 of the Z positioner 134. The fluid dispenser 122 and camera 102 are attached to the bracket 150 and are movable with the bracket 150. In alternative embodiments, the fluid dispenser 122 may be independently moveable with respect to the camera 102, rather than both being attached to the bracket 150.

The fluid dispensing machine 100 includes a guidance system 160 that provides visual guidance for the fluid dispensing process. The camera 102 forms part of the guidance system 160. The camera 102 is aimed at the work zone 114 and takes images of the fluid dispenser 122 and/or the substrate 104. Optionally, the camera 102 may take continuous images and the fluid dispensing machine 100 may continuously update operation based on such images. Alternatively, the camera 102 may take images at predetermined times, such as at each new substrate location prior to dispensing fluid, at various stages of the fluid dispensing (e.g. after each conductive trace is coated), at predetermined times intervals (e.g. 1 image per second), and the like.

In an exemplary embodiment, the guidance system 160 includes an optical component 162 for controlling optical characteristics of the fluid dispensing machine 100. For example, the optical component 162 may include an illumination source for illuminating the work zone 114, fluid dispenser 122 and/or the substrate 104. The illumination source may emit lights at different wavelengths on the substrate to facilitate identification of characteristics of the substrate, such as a boundary between the dispensed fluid and areas of the substrate having no dispensed fluid thereon. The different light wavelengths may be used to distinguish the dispensed fluid from the substrate or to distinguish the substrate body from the conductive traces of the substrate. The machine vision guidance may be enhanced by the illumination using light wavelength in the optical spectrum of incoming light. The illumination may enhance the contrast of the image for the vision recognition algorithm of the controller to operate. Optionally, the dispensing fluid may include a material that is illuminated by the illumination source to distinguish boundaries. For example, the illumination source may emit infrared or UV light that is illuminated by the fluid but not by the substrate to facilitate boundary identification and/or for post application inspection of dispensed accuracy. Optionally, a heat plate may be provided to heat the fluid to enhance curing of the fluid.

The fluid dispensing machine 100 includes a controller 170 that controls operation of the fluid dispensing machine 100. The controller 170 communicates with the positioning system 120 and the guidance system 160. For example, the images generated by the camera 102 are processed by the controller 170. The controller 170 may receive other inputs from other devices or sensors other than the camera, such as information relating to the engineering fluid, that are used by the algorithms to control the motion profile and process parameters.

The controller 170 includes a motion planning and process parameter calculation algorithm. For example, the controller 170 may include a motion planning algorithm that formulates a motion profile that controls operation of the positioning system 120. The controller 170 may include a fluid dispensing algorithm that controls operation of the fluid dispenser 122. For example, operation of the fluid dispenser 122 may be controlled based on the position of the fluid dispenser 122 relative to the substrate 104. The motion planning algorithm and the fluid dispensing algorithm may both be based on the images provided by the camera 102. For example, the algorithms may use data generated by a machine vision algorithm based on the collect image. The controller 170 identifies each location where fluid is to be dispensed (e.g. the portions of the conductive traces that need to be covered by the engineering fluid), including the shape and location of the dispensing zone. The controller 170 determines a plan for moving the fluid dispenser 122 to the necessary locations. The controller 170 calculates a series of movements for the positioning system 120 to efficiently move the fluid dispenser 122 to the necessary locations. The controller 170 determines when the fluid dispenser 122 should be dispensing and when the fluid dispenser 122 should not be dispensing. Such determination is based on the location of the fluid dispenser 122. In an exemplary embodiment, the controller 170 may use the vision guidance system to check the accuracy of the fluid dispensing, such as by comparing the shape of the boundary with a targeted dispensing shape. The controller 170 may compensate for differences between the actual boundary and the targeted boundary, such as by updating or changing the motion profile or the fluid dispensing pattern.

In an exemplary embodiment, the illumination source emits the lights onto the substrate 104 to assist the controller 170 in identifying the characteristics of the substrate 104. The identification process may be based on the intensity of the data points in the image. For example, different materials (e.g. plastic, metal, engineering fluid) may have different intensity levels in the image, which aids the controller 170 in identifying boundaries between the different materials. The fluid may be impregnated with material, such as fluorescent material, that may be easily identified using certain lighting or camera techniques.

The controller 170 controls the X, Y, Z and/or angular position of the fluid dispenser 122 during operation of the fluid dispensing machine 100. The controller 170 controls the X, Y, Z and/or angular position of the camera 102 during operation of the fluid dispensing machine 100. The controller 170 uses the motion planning algorithm to develop a motion profile for positioning the fluid dispenser relative to the substrate and the controller 170 uses the fluid dispensing algorithm to determine when to dispense the fluid onto the substrate 104. In operation, the controller 170 positions the camera 102 and fluid dispenser 122 at a series of stations, where a corresponding substrate 104 is provided at each station. At each station, the camera 102 images the characteristics of the substrate 104 and the controller 170 determines a series of steps to efficiently dispense fluid thereon. Once the fluid is dispensed, the controller 170 moves the camera 102 and fluid dispenser 122 to the next station and dispenses fluid thereon. The controller 170 may plan a different motion profile and fluid dispensing pattern at each station because the substrates 104 at each station may be different. The controller 170 may move the fluid dispenser to a purging station during or after dispensing of fluid on the substrate 104.

Optionally, the engineering fluid may be cured or otherwise processed after dispensing such that another layer of the fluid or another type of engineering fluid may be dispensed over the cured or processed fluid. A stack-up of layers may be provided on the substrate by such process. The fluid may be UV cured, thermally cured or otherwise processed to change characteristics of the fluid. Optionally, more than one fluid dispenser may be provided or the fluid dispenser may be able to dispense different types of fluid.

Figure 2:
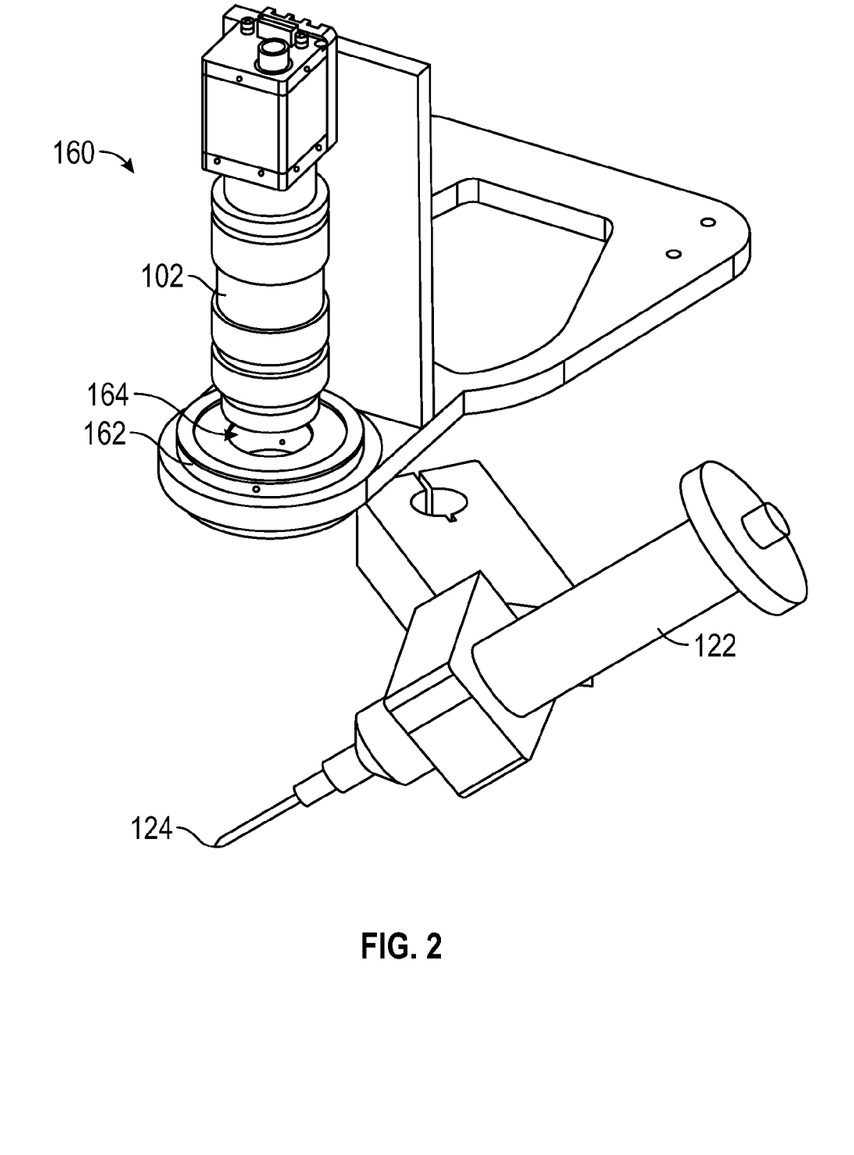
FIG. 2 illustrates a camera and fluid dispenser of the fluid dispensing machine.

FIG. 2 illustrates the camera 102 and fluid dispenser 122 mounted to the bracket 150. The camera 102 provides visual feedback for control of the machine. The position of the camera 102 and optical component 162 relative to the bracket 150 may be adjustable. The positions may be manually adjustable or automatically adjustable. The camera 102 is positioned directly above an opening 164 in the optical component 162 and aimed through the opening 164. The opening 164 defines the field of view for the images taken by the camera 102. The fluid dispenser 122 is positioned below the optical component 162. In an exemplary embodiment, the camera 102 is positioned directly above the tip 124 of the fluid dispenser 122. The fluid dispenser 122 may be viewable by the camera 102 through the opening 164. Alternatively, if not viewable, the position of the fluid dispenser 122 relative to the image may be known and used by the controller 170 (shown in FIG. 1) to control movements of the fluid dispenser 122. Optionally, the fluid dispenser 122 may be movable relative to the camera 102. Optionally, multiple cameras may be provided to view the dispensing region from different angles.

Figure 3:
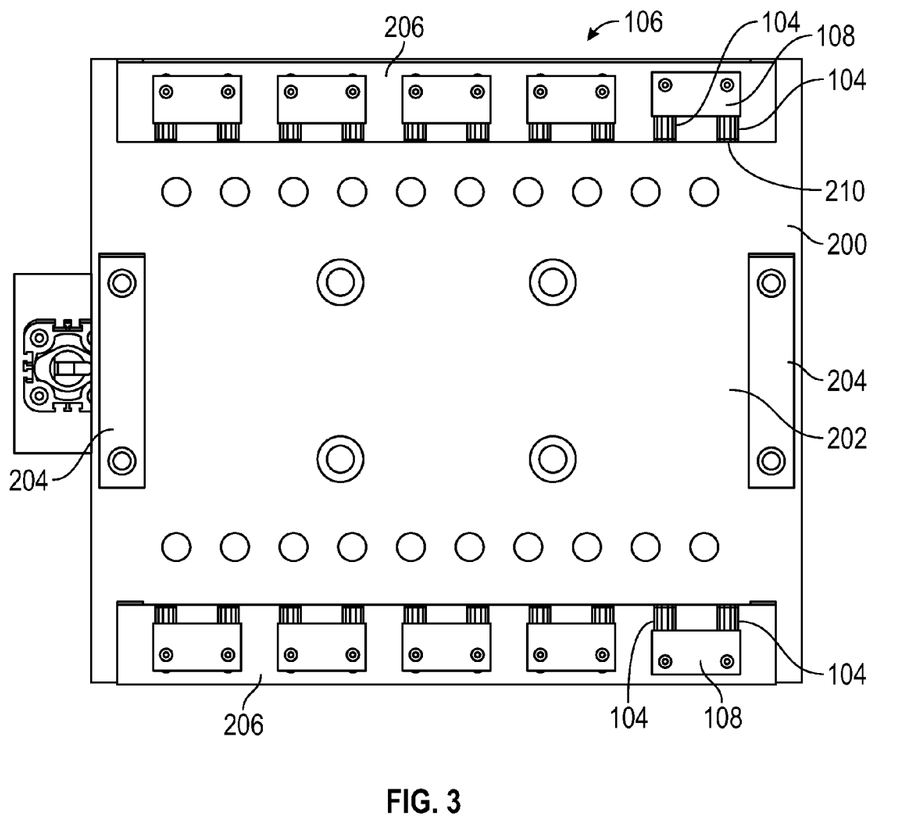
FIG. 3 is a top view of a fixture for the fluid dispensing machine.

FIG. 3 is a top view of the fixture 106 with the substrates 104 held in place by the holders 108. Optionally, each holder 108 may hold more than one substrate 104. The holders 108 may be spring biased against the substrates 104 to clamp the substrates 104 in position. The fixture 106 may hold any number of substrates 104.

The fixture 106 includes a plate 200 having an upper surface 202. Stand-offs 204 extend from the upper surface 202 at opposite ends of the plate 200. The stand-offs 204 are used to support another component, such as another fixture that holds cables and wires for termination to the substrates 104. For example, after the other fixture is positioned on the fixture 106, the wires of the cables are aligned with corresponding conductive traces of the substrates 104 for soldering thereto.

The fixture 106 includes platforms 206 that hold the substrates 104. In the illustrated embodiment, two platforms 206 are provided at opposite sides of the fixture 106. The platforms 206 are elevated above the upper surface 202.

Figure 4:
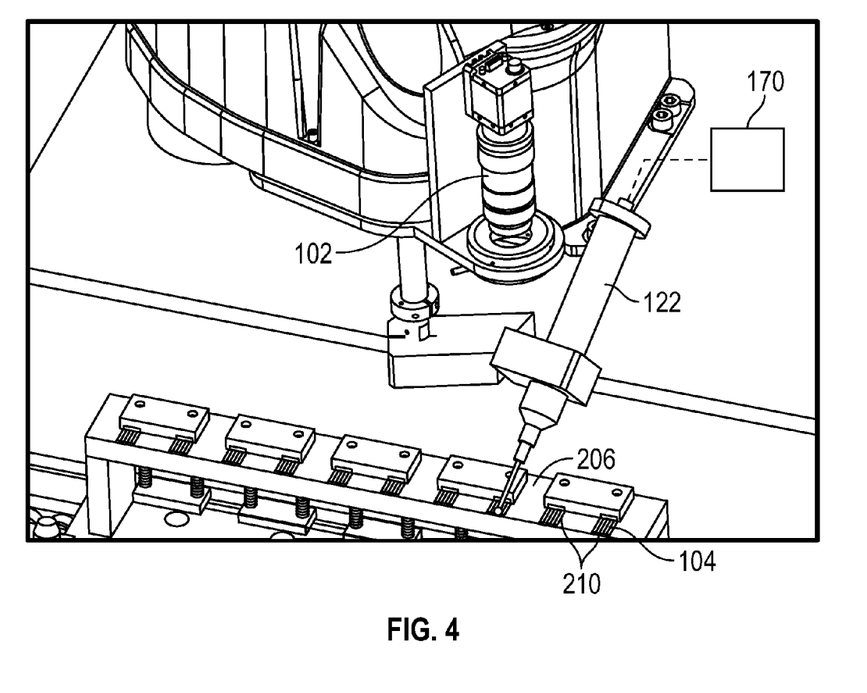
FIG. 4 is an enlarged view of a portion of the fluid dispensing machine showing the fluid dispenser dispensing fluid on a substrate held by the fixture.

FIG. 4 is an enlarged view of a portion of the fluid dispensing machine 100 showing the fluid dispenser 122 dispensing fluid on one of the substrates 104. The platforms 206 are shown holding the substrates 104. The camera 102 is positioned above the fluid dispenser 122 to provide vision assistance to the fluid dispensing process.

In the illustrated embodiment, the substrates 104 each include conductive traces 210 on a surface of the substrate body. The engineering fluid is being dispensed onto the conductive traces 210. For example, the engineering fluid may be solder applied to the conductive traces 210 as a paste.

The motion and dispensing is controlled by the controller 170 (shown in FIG. 1) based on the images taken by the camera 102. The motion and dispensing may be updated throughout the dispensing process. The controller 170 may compare the shape of the boundary with a targeted dispensing shape to modify the operation of the fluid dispensing machine 100.

Figure 5:
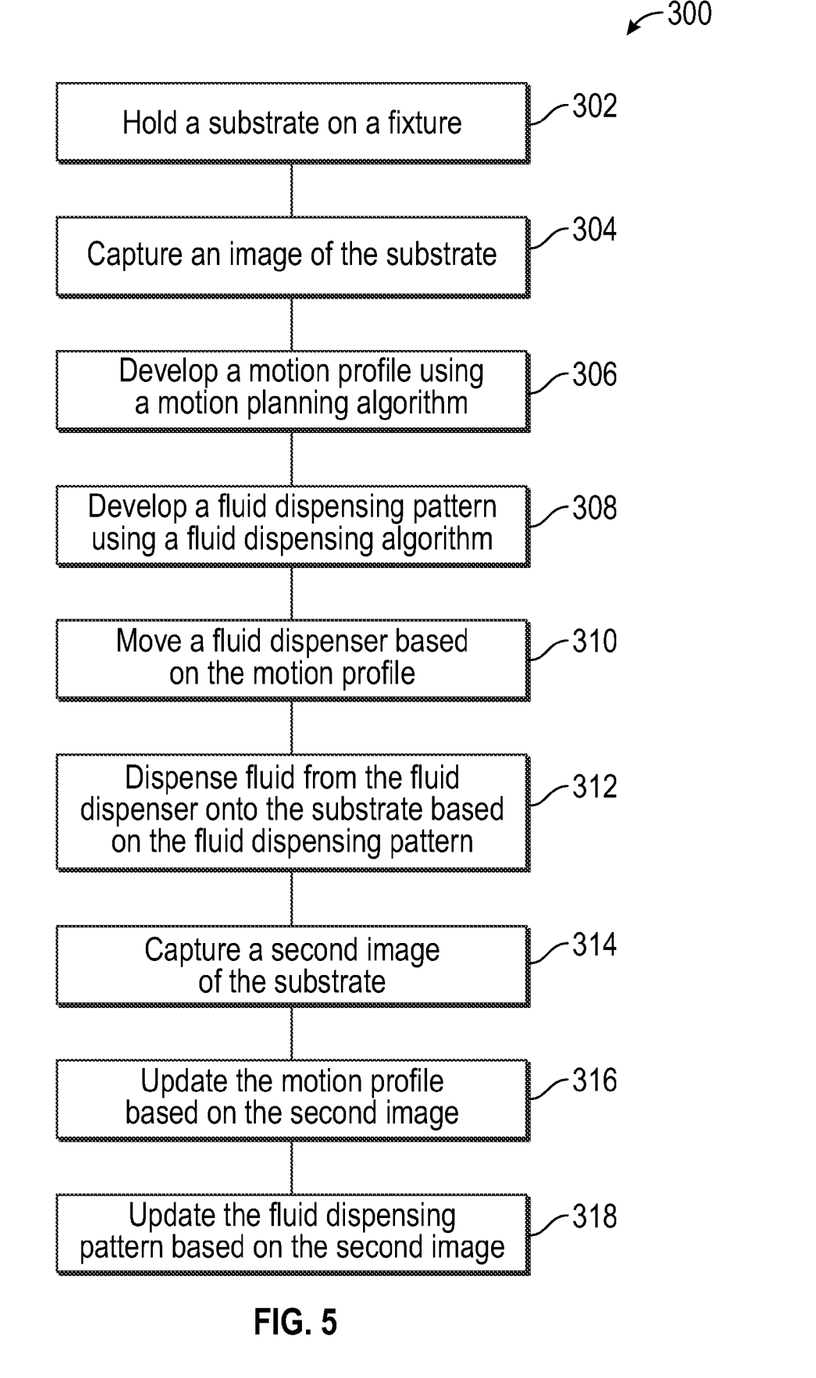
FIG. 5 illustrates a method of dispensing fluid onto a substrate.

FIG. 5 illustrates a method 300 of dispensing fluid onto a substrate. At 302, the method includes holding a substrate on a fixture. For example, the substrate may be held by a spring loaded holder. The substrate is held such that portions of the substrate are exposed for processing. For example, conductive traces of the substrate may be exposed for applying engineering fluid (e.g. epoxy, adhesive, solder, plating, and the like) thereto.

At 304, the method includes capturing an image of a substrate. The image may be captured by a camera aimed at the work zone of the substrate. The camera views the characteristics of the substrate, such as the arrangement of the conductive traces. The camera may capture more than one image. Multiple cameras may be provided to view different portions or angles of the work zone. Optionally, the work zone may be illuminated by an illumination source. The substrate may be illuminated by lights of different wavelengths. Different portions of the substrate may be affected differently by the different wavelength lights.

At 306, the method includes developing a motion profile for the fluid dispensing machine. The motion profile controls movement of a fluid dispenser that dispenses fluid onto the substrate. The motion profile includes a set of instructions executable by a computer to control operation of the fluid dispensing machine. In an exemplary embodiment, the fluid dispensing machine includes a controller for controlling operation of the fluid dispensing machine. The controller includes a motion planning algorithm that determines how the fluid dispenser should be moved relative to the substrate to dispense fluid thereon. The controller may distinguish between the different materials of the substrate, such as the plastic, metal, fluid, and the like. For example, when the substrate is illuminated by lights of different wavelength, the controller may determine boundaries between the different materials using recognition software. In an exemplary embodiment, the controller determines the shape and arrangement of the conductive traces and the boundaries of the conductive traces. The controller may determine boundaries between already dispensed fluid and the conductive trace or the substrate body to determine where the fluid dispenser needs to move to apply more fluid. The controller may be able to utilize multiple images from multiple cameras to recreate 3 dimensional data of the dispensed fluid object to better assist motion planning and process control. Data from the image is used to generate the motion profile and the fluid dispensing machine is operated according to the motion profile. Optionally, the motion profile may be updated and corrected for after or during fluid dispensing.

At 308, the method includes developing a fluid dispensing pattern for the fluid dispensing machine. The fluid dispensing pattern may be determined by a fluid dispensing algorithm. The fluid dispensing algorithm controls when the fluid dispenser dispenses fluid onto the substrate. The fluid dispensing algorithm develops a set of instructions executable by a computer to control operation of the fluid dispensing machine. The controller determines when the fluid dispenser should dispense fluid based on the location of the fluid dispenser relative to the substrate. Data from the image is used to generate the fluid dispensing pattern. Optionally, the fluid dispensing pattern may be updated and corrected for after or during fluid dispensing.

At 310, the method includes moving the fluid dispenser based on the motion profile. For example, the fluid dispensing machine may include positioners that move the fluid dispenser relative to the fixture.

At 312, the method includes dispensing fluid from the fluid dispenser onto the substrate based on the fluid dispensing pattern. As the fluid dispenser is moved along the motion profile, the controller controls activation and deactivation of the fluid dispenser to apply the fluid in the appropriate locations.

At 314, in some embodiments, the method may include capturing a second image of the substrate. The second image may be captured after or during fluid dispensing. At 316, the motion profile may be updated, such as based on the second image. At 318, the fluid dispensing pattern may be updated, such as based on the second image. Updating of the motion profile and/or fluid dispensing pattern ensures accurate placement of the fluid on the substrate. In other embodiments, other quality control processes may be used other than taking a second image and updating the motion profile based on the second image. For example, a volume monitoring system may monitor an volume of fluid dispensed to assure quality dispensing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A fluid dispensing machine comprising:
   a frame;
   a fixture held by the frame, the fixture being configured to support a substrate;
   a positioning system supported by the frame, the positioning system having a movable arm;
   a guidance system supported by the arm of the positioning system, the guidance system having a camera viewing a work area of the substrate held by the fixture along a camera viewing axis, the camera being movable by the arm relative to the fixture, the camera being oriented with the camera viewing axis normal to the work area of the substrate directly vertically above the work area;
   a fluid dispenser supported by the arm of the positioning system and moved by the arm of the positioning system relative to the fixture, the fluid dispenser being configured to dispense fluid onto the substrate at the work area directly vertically below the camera, wherein the fluid dispenser is movable by the arm of the positioning system with the camera such that the relative positions of the camera and the fluid dispenser remain unchanged; and a controller communicating with the positioning system and the guidance system, the controller operating the positioning system to change a position of the arm to control a position of the fluid dispenser and the camera relative to the fixture based on an image obtained by the camera, wherein the controller develops a motion profile for the positioning system to move the fluid dispenser, the motion profile being updated based on images taken by the camera during fluid dispensing.

2. The fluid dispensing machine of claim 1, wherein the camera is configured to image the substrate at the work area where the fluid is dispensed, the controller differentiating a boundary between the dispensed fluid and the substrate, the controller operating the positioning system to control a position of the fluid dispenser based on the boundary.

3. The fluid dispensing machine of claim 1, wherein the fixture holds a plurality of the substrates at different stations, the positioning system moving the fluid dispenser from station to station to dispense fluid at each of the stations.

4. The fluid dispensing machine of claim 1, wherein the fluid dispenser dispenses solder paste along a conductive trace on the substrate.

5. The fluid dispensing machine of claim 1, wherein the camera images the substrate after the fluid is dispensed to ensure proper dispensing of the fluid, the controller causing the positioning system to move the fluid dispenser to re-dispense fluid in areas with inadequate fluid.

6. The fluid dispensing machine of claim 5, wherein the controller updates operation of the positioning system based on the new image of the substrate.

7. The fluid dispensing machine of claim 1, wherein the positioning system includes an angular positioner to control an angle of the fluid dispenser relative to the fixture.

8. The fluid dispensing machine of claim 1, wherein the guidance system includes an optical component affecting an image of the substrate taken by the camera.

9. The fluid dispensing machine of claim 1, wherein the guidance system includes an optical component, the optical component having an illumination source emitting light at different wavelengths on the substrate, the controller differentiating a boundary between the dispensed fluid and the substrate based on the light emitted by the illumination source.

10. The fluid dispensing machine of claim 1, wherein the controller operates a boundary recognition algorithm determining a shape and position of the fluid on the substrate, the controller determining a motion profile for moving the fluid dispenser based on the determined shape and positioning of the boundary.

11. The fluid dispensing machine of claim 1, wherein the positioning system includes an X positioner, a Y positioner, and a Z positioner to control a position of the fluid dispenser in 3D space.

12. The fluid dispensing machine of claim 1, wherein the fixture is fixed relative to the frame, the fixture holding a plurality of substrates, the camera and the fluid dispenser being movable by the positioning system to each of the plurality of substrates for processing each of the plurality of substrates.

13. The fluid dispensing machine of claim 1, wherein the camera is configured to image the substrate at the work area where the fluid is dispensed, the controller differentiating a boundary between the dispensed fluid and conductive traces of the substrate, the controller operating the positioning system to control a position of the fluid dispenser based on the boundary.

* * * * *